United States Patent
Aoki et al.

(10) Patent No.: US 12,080,467 B2
(45) Date of Patent: Sep. 3, 2024

(54) COIL COMPONENT, CIRCUIT BOARD, AND ELECTRONIC DEVICE

(71) Applicant: TAIYO YUDEN CO., LTD., Tokyo (JP)

(72) Inventors: Hidenori Aoki, Tokyo (JP); Tomoo Kashiwa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 415 days.

(21) Appl. No.: 17/131,258

(22) Filed: Dec. 22, 2020

(65) Prior Publication Data

US 2021/0202159 A1    Jul. 1, 2021

(30) Foreign Application Priority Data

Dec. 27, 2019  (JP) .................................. 2019-239031

(51) Int. Cl.
*H01F 27/29*   (2006.01)
*H01F 17/00*   (2006.01)
(Continued)

(52) U.S. Cl.
CPC ....... *H01F 27/292* (2013.01); *H01F 17/0013* (2013.01); *H01F 27/2828* (2013.01); *H01F 27/306* (2013.01); *H05K 3/301* (2013.01)

(58) Field of Classification Search
CPC ............... H01F 27/292; H01F 17/0013; H01F 27/2828; H01F 27/306; H05K 3/301
See application file for complete search history.

(56) References Cited

U.S. PATENT DOCUMENTS

2005/0253677 A1* 11/2005 Ito ....................... H01F 17/0013
                                                       336/200
2006/0001517 A1*  1/2006 Cheng ................. H01F 41/0246
                                                        336/83
(Continued)

FOREIGN PATENT DOCUMENTS

JP    2008-053754 A    3/2008
JP    2008-091433 A    4/2008
(Continued)

OTHER PUBLICATIONS

Notice of Reasons for Refusal dated Aug. 22, 2023, issued in corresponding Japanese Patent Application No. 2019-239031, with English translation (9 pgs.).

(Continued)

*Primary Examiner* — Malcolm Barnes
(74) *Attorney, Agent, or Firm* — Pillsbury Winthrop Shaw Pittman, LLP

(57) ABSTRACT

One aspect of the present invention provides a coil component including a base body having a first surface extending along a coil axis and a second surface opposing the first surface, a first external electrode provided on the base body, a second external electrode provided on the base body, and a coil conductor electrically connected to the first and second external electrodes, where the coil conductor extends around the coil axis. In one embodiment, the coil conductor has a winding portion, the winding portion has a plurality of first conductor portions and one or more second conductor portions smaller in number than the first conductor portions, and the first and second conductor portions alternate with and are connected to each other, and a distance between the first conductor portions and the first surface is greater than a distance between the second conductor portions and the second surface.

15 Claims, 9 Drawing Sheets

(51) Int. Cl.
H01F 27/28 (2006.01)
H01F 27/30 (2006.01)
H05K 3/30 (2006.01)

(56) References Cited

U.S. PATENT DOCUMENTS

| | | | | |
|---|---|---|---|---|
| 2009/0128275 | A1* | 5/2009 | Yagasaki | H01F 17/04 336/83 |
| 2013/0300529 | A1* | 11/2013 | Chang | H01F 27/292 336/200 |
| 2015/0035634 | A1* | 2/2015 | Nakamura | H01F 41/046 336/170 |
| 2017/0178789 | A1* | 6/2017 | Kim | H01F 17/04 |
| 2018/0122546 | A1* | 5/2018 | Lee | H01F 27/24 |
| 2018/0174740 | A1 | 6/2018 | Muneuchi | |
| 2018/0308609 | A1* | 10/2018 | Shinohara | H01F 1/15333 |
| 2019/0096568 | A1* | 3/2019 | Yoon | H01F 17/0013 |
| 2019/0318854 | A1* | 10/2019 | Park | B22F 1/052 |
| 2019/0392978 | A1* | 12/2019 | Matsuura | H01F 1/26 |
| 2020/0152373 | A1* | 5/2020 | Sato | H01F 27/292 |
| 2020/0279678 | A1* | 9/2020 | Yoshidome | H01F 17/0013 |
| 2021/0142939 | A1* | 5/2021 | Li | H01F 27/323 |

FOREIGN PATENT DOCUMENTS

| | | |
|---|---|---|
| JP | 2015-079931 A | 4/2015 |
| JP | 2018-101732 A | 6/2018 |

OTHER PUBLICATIONS

Decision of Refusal dated Jan. 16, 2024, issued in corresponding Japanese Patent Application No. 2019-239031, with English translation (7 pgs.).

* cited by examiner

COIL COMPONENT, CIRCUIT BOARD, AND ELECTRONIC DEVICE

CROSS-REFERENCE TO RELATED APPLICATIONS

This application is based on and claims the benefit of priority from Japanese Patent Application Serial No. 2019-239031 (filed on Dec. 27, 2019), the contents of which are hereby incorporated by reference in their entirety.

TECHNICAL FIELD

The present disclosure relates to a coil component, a circuit board, and an electronic device.

BACKGROUND

There are conventional coil components including a magnetic base body formed of a magnetic material, an external electrode provided on the surface of the magnetic base body, and a coil conductor arranged in the magnetic base body and extending around a coil axis.

Coil components are, for example, inductors. Inductors are passive elements used in electronic circuits. For example, inductors eliminate noise in power source or signal lines. A conventional inductor is disclosed in Japanese Patent Application Publication No. 2018-0101732 ("the '732 Publication"). As disclosed in '732 Publication, there is a demand for more compact inductors. Here, note that coil components are required to have high inductance.

As typically presented in FIG. 1 of the '732 Publication, conventional coil components are designed such that the winding portion of the coil conductor is at equal distances from the paired side surfaces of the base body. Although some manufacturing errors may occur, the coil conductor is placed in the base body with the equal distances being maintained. If the overall size of the base body of such conventional coil components is reduced in order to realize more compact coil components, a sufficiently large region cannot be left between the coil conductor and the pair of side surfaces of the base body to allow the magnetic flux lines to pass therethrough. This may deteriorate the inductance. On the other hand, if the distance between the coil conductor and the pair of side surfaces of the base body is increased to improve the inductance, the overall size of the base body disadvantageously increases.

SUMMARY

One object of the present invention disclosed herein is to overcome or mitigate the above drawback related to conventional coil components. One of more specific goals to be achieved by the invention disclosed herein is to provide a smaller coil component with it being possible to prevent the deterioration of the inductance. The other objects of the disclosure will be apparent with reference to the entire description in this specification. The invention disclosed herein may solve any other problems grasped from the following description herein instead of or in addition to the above drawback.

One aspect of the present invention provides a coil component including a base body having a first surface extending along a coil axis and a second surface opposing the first surface, a first external electrode provided on the base body, a second external electrode provided on the base body, and a coil conductor electrically connected to the first and second external electrodes, where the coil conductor extends around the coil axis. In one embodiment, the coil conductor has a winding portion, the winding portion has a plurality of first conductor portions and one or more second conductor portions smaller in number than the first conductor portions, and the first and second conductor portions alternate with and are connected to each other, and a distance between the first conductor portions and the first surface is greater than a distance between the second conductor portions and the second surface.

In one embodiment, the base body has a third surface extending along the coil axis and connecting together the first and second surfaces, and, when seen in a direction along the coil axis, the first surface has a larger size than the third surface, and the coil conductor has a larger size in a direction parallel to the first surface than in a direction parallel to the third surface.

In one embodiment, in the winding portion, the number of the first conductor portions is five and the number of the second conductor portions is four.

In one embodiment, in the winding portion, the number of the first conductor portions is four and the number of the second conductor portions is three.

In one embodiment, in the winding portion, the number of the first conductor portions is three and the number of the second conductor portions is two.

In one embodiment, in the winding portion, the number of the first conductor portions is two and the number of the second conductor portions is one.

In one embodiment, D1 represents a distance between the first conductor portions and the first surface and D2 represents a distance between the second conductor portions and the second surface, and a ratio D1/D2 ranges from 1.2 to 5.0.

In one embodiment, in the coil conductor, the number of the second conductor portions is smaller by one than the number of the first conductor portions.

One embodiment of the present invention relates to a DC/DC converter including the above-described coil component.

One embodiment of the present invention provides a circuit board including the above-described coil component, and a mounting substrate soldered to the first and second external electrodes.

One embodiment of the present invention provides an electronic device including the above-described circuit board.

ADVANTAGEOUS EFFECTS

The embodiments of the present invention can provide a more compact coil component with it being possible to prevent deterioration of the inductance.

DESCRIPTION OF THE PREFERRED EMBODIMENTS

Various embodiments of the present invention will be hereinafter described with reference to the drawings. The constituents common to more than one drawing are denoted by the same reference signs throughout the drawings. It should be noted that the drawings do not necessarily appear to an accurate scale for the sake of convenience of explanation.

Figure 1:
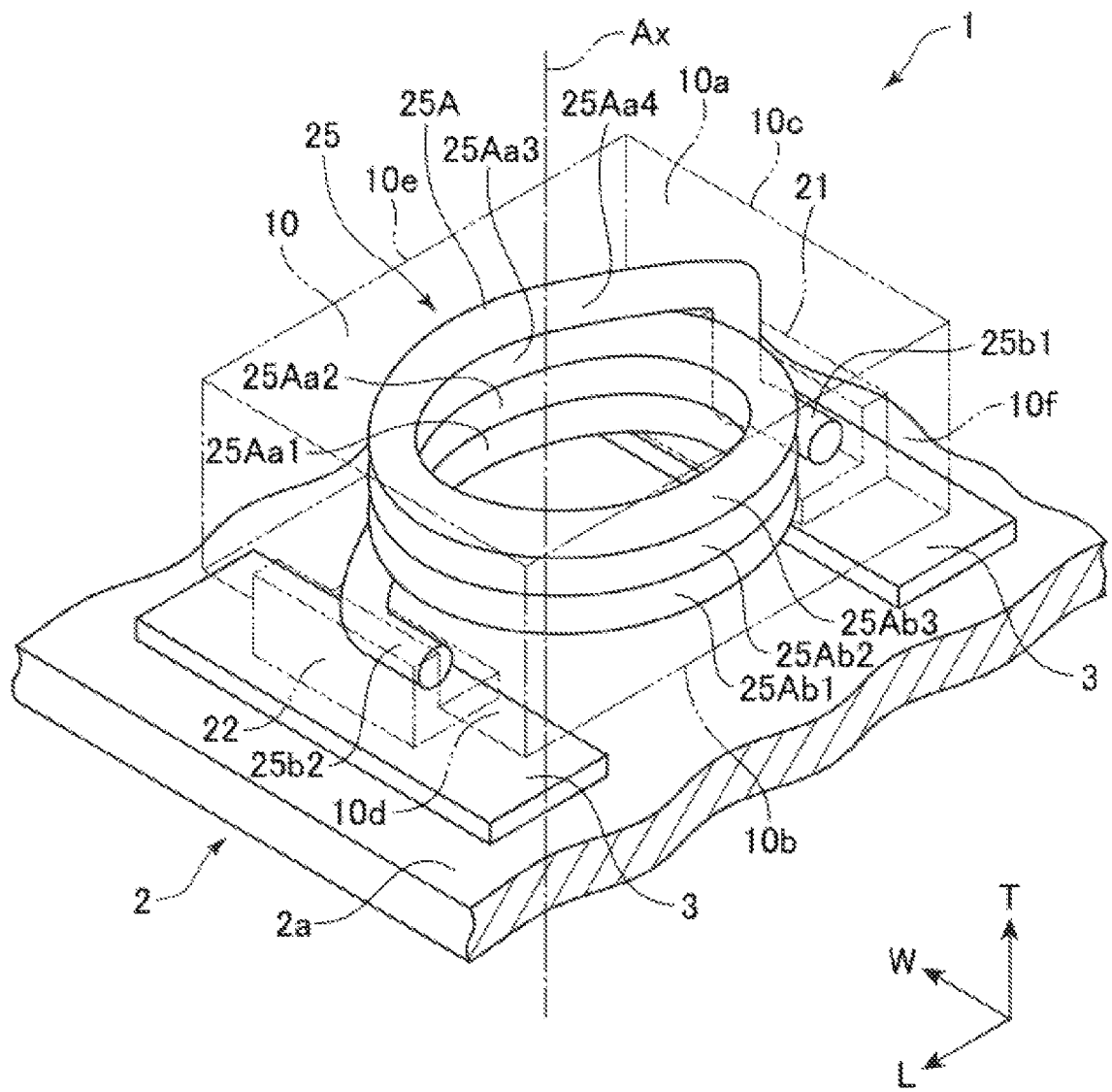
FIG. 1 is a perspective view schematically showing a coil component according to one embodiment of the present invention.
Figure 2:
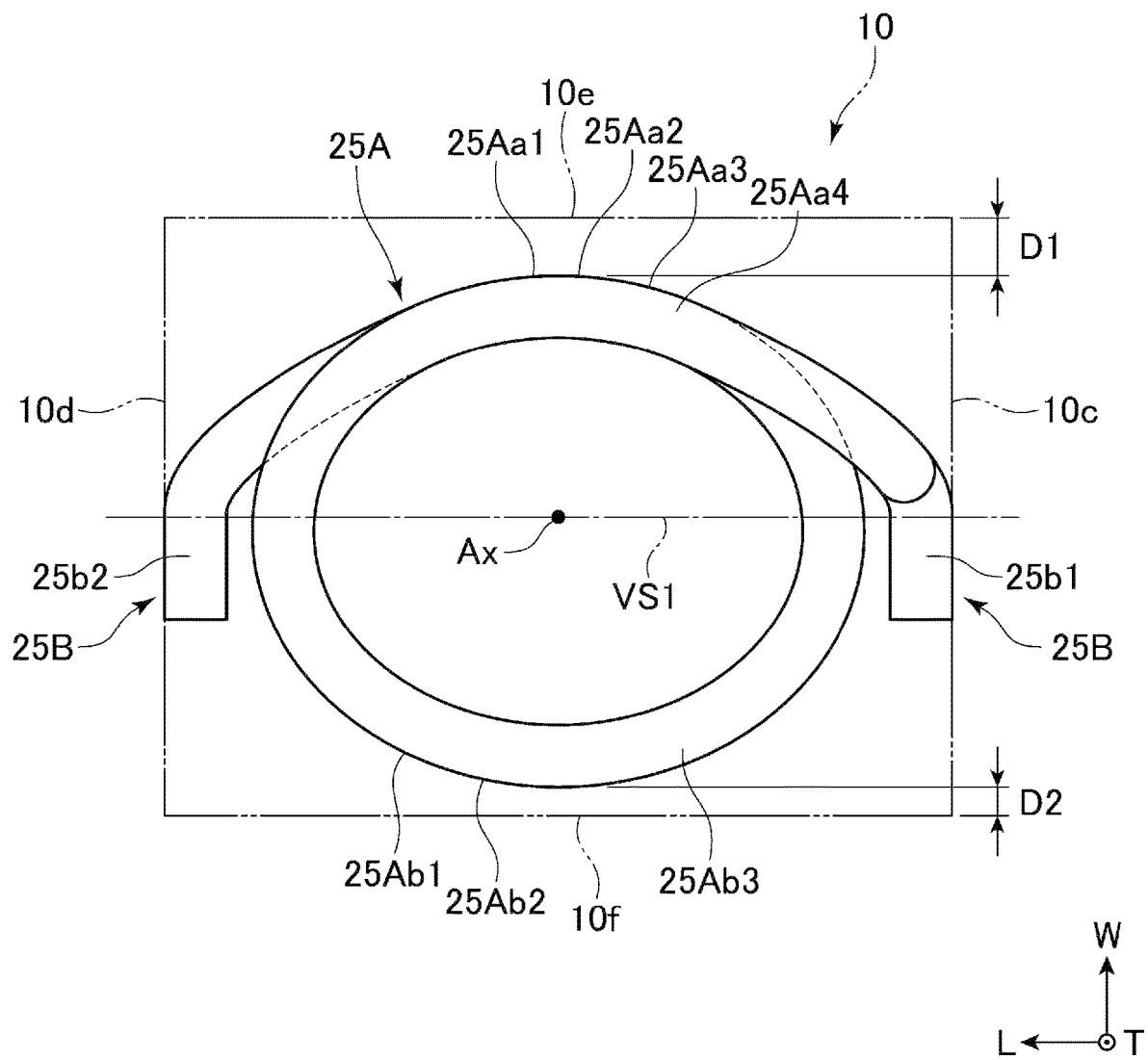
FIG. 2 is a schematic plan view of the coil component shown in FIG. 1.

A coil element 1 according to one embodiment of the present invention will be hereinafter described with reference to FIGS. 1 and 2. FIG. 1 is a schematic perspective view of the coil component 1, and FIG. 2 is a schematic plane view of the coil component 1. As shown, the coil component 1 includes a magnetic base body 10, a coil conductor 25 disposed in the magnetic base body 10, an external electrode 21 disposed on the surface of the magnetic base body 10, and an external electrode 22 disposed on the surface of the magnetic base body 10 at a position spaced apart from the external electrode 21.

In this specification, a "length" direction, a "width" direction, and a "thickness" direction of the coil component 1 are referred to as an "L axis" direction, a "W axis" direction, and a "T axis" direction, which are identified in FIG. 1, respectively, unless otherwise construed from the context. The "thickness" direction may be also referred to as the "height" direction.

The coil component 1 is mounted on a mounting substrate 2a. A circuit board 2 includes the coil component 1 and the mounting substrate 2a having the coil component 1 mounted thereon. The mounting substrate 2a has two land portions 3 provided thereon. The coil component 1 is mounted on the mounting substrate 2a by bonding the external electrodes 21, 22 to the corresponding land portions 3 of the mounting substrate 2a. The circuit board 2 can be installed in various electronic devices. The electronic devices in which the circuit board 2 may be installed include smartphones, tablets, game consoles, electrical components of automobiles, and various other electronic devices.

The coil component 1 may be applied to inductors, transformers, filters, reactors, and various other coil components. The coil component 1 may also be applied to coupled inductors, choke coils, and various other magnetically coupled coil components. The coil component 1 may be, for example, an inductor used in a DC/DC converter. Applications of the coil component 1 are not limited to those explicitly described herein.

The magnetic base body 10 is made of a magnetic material and formed in a rectangular parallelepiped shape as a whole. In one embodiment of the invention, the magnetic base body 10 has a length (the dimension in the L axis direction) of 1.6 to 4.5 mm, a width (the dimension in the W axis direction) of 0.8 to 3.2 mm, and a height (the dimension in the T axis direction) of 0.8 to 5.0 mm. The dimensions of the magnetic base body 10 are not limited to those specified herein. The term "rectangular parallelepiped" or "rectangular parallelepiped shape" used herein is not intended to mean solely "rectangular parallelepiped" in a mathematically strict sense.

The magnetic base body 10 has a first principal surface 10a, a second principal surface 10b, a first end surface 10c, a second end surface 10d, a first side surface 10e, and a second side surface 10f. The outer surface of the magnetic base body 10 is defined by these six surfaces. The first principal surface 10a and the second principal surface 10b are surfaces at the opposite ends in the height direction, the first end surface 10c and the second end surface 10d are surfaces at the opposite ends in the length direction, and the first side surface 10e and the second side surface 10f are surfaces at the opposite ends in the width direction.

As shown in FIG. 1, the first principal surface 10a lies on the top side of the magnetic base body 10, and therefore, the first principal surface 10a may be herein referred to as "the top surface." Similarly, the second principal surface 10b may be referred to as "the bottom surface." The coil component 1 is disposed such that the second principal surface 10b faces the substrate 2, and therefore, the second principal surface 10b may be herein referred to as "the mounting surface." The top-bottom direction of the coil component 1 refers to the top-bottom direction in FIG. 1.

In one embodiment of the present invention, the external electrode 21 extends on the mounting surface 10b and the end surface 10c of the magnetic base body 10. The external electrode 22 extends on the mounting surface 10b and the end surface 10d of the magnetic base body 10. The shapes and positioning of the external electrodes 21, 22 are not limited to those in the example shown. The external electrodes 21 and 22 are separated from each other in the length direction.

In one embodiment, the magnetic base body 10 is made of a composite magnetic material containing a plurality of types of metal magnetic particles and a binder. The metal magnetic particles may be a particle mixture obtained by mixing together a plurality of types of metal magnetic particles having different average particle sizes. When the metal magnetic particles contain large-diameter metal magnetic particles and small-diameter metal magnetic particles, the large-diameter metal magnetic particles have an average particle size of, for example, 10 μm, and the small-diameter metal magnetic particles have an average particle size of, for example, 1 μm. The binder binds together the plurality of types of metal magnetic particles. The binder is, for example, a highly insulating thermosetting resin. The magnetic base body 10 may be a green compact in which the metal magnetic particles are bound together without the use of a binder.

The metal magnetic particles are made of various soft magnetic materials. For example, a main ingredient of the metal magnetic particles is Fe. Specifically, the metal magnetic particles are particles of (1) a metal such as Fe or Ni, (2) a crystalline alloy such as an Fe—Si—Cr alloy, an Fe—Si—Al alloy, or an Fe—Ni alloy, (3) an amorphous alloy such as an Fe—Si—Cr—B—C alloy or an Fe—Si—Cr—B alloy, or (4) a mixture thereof. The composition of the metal magnetic particles contained in the magnetic base body 10 is not limited to those described above. The metal magnetic particles may have, on their respective surfaces, an insulting film formed of, for example, a glass, a resin, or other highly insulating materials.

The coil conductor 25 includes a winding portion 25A and lead-out conductors 25B. The winding portion 25A is wound spirally around a coil axis Ax extending along the thickness direction (the T direction), and the lead-out conductors 25B led out from the opposite ends of the winding portion 25A to connect the opposite ends to the external electrodes 21, 22, respectively. The lead-out conductors 25B include a first lead-out conductor 25b1 connecting one of the ends of the winding portion 25A and the external electrode 21 and a second lead-out conductor 25b2 connecting the other end of the winding portion 25A and the external electrode 22. In the illustrated embodiment, the coil axis Ax intersects the first and second principal surfaces 10a and 10b, but does not intersect the first and second end surfaces 10c and 10d and the first and second side surfaces 10e and 10f. In other words, the first and second end surfaces 10c and 10d and the first and second side surfaces 10e and 10f extend along the coil axis A.

In the winding portion 25A, a plurality of first conductor portions and one or more second conductor portions smaller in number than the first conductor portions alternate with and are connected to each other. In the illustrated embodiment, the winding portion 25A includes four first conductor portions 25Aa1 to 25Aa4 and three second conductor portions 25Ab1 to 25Ab3. The first conductor portions 25Aa1 to 25Aa4 are example first conductor portions included in the winding portion 25A, and the second conductor portions 25Ab1 to 25Ab3 are example second conductor portions included in the winding portion 25A. The number of first conductor portions included in the winding portion 25A is not limited to four. In one embodiment, the number of first conductor portions included in the winding portion 25A ranges from two to five. In one embodiment, the number of second conductor portions included in the winding portion 25A is smaller by one than the number of first conductors. The number of second conductor portions included in the winding portion 25A ranges from one to four, for example.

More specifically, the winding portion 25A includes: the first conductor portion 25Aa1 connected to the second lead-out conductor 25b2 and extending from its connection with the second lead-out conductor 25b2 clockwise around the coil axis Ax; the second conductor portion 25Ab1 extending clockwise around the coil axis Ax from the end of the first conductor portion 25Aa1 opposite to its end connected to the second lead-out conductor 25b2; the first conductor portion 25Aa2 extending clockwise around the coil axis Ax from the end of the second conductor portion 25Ab1 opposite to its end connected to the first conductor portion 25Aa1; the second conductor portion 25Ab2 extending clockwise around the coil axis Ax from the end of the first conductor portion 25Aa2 opposite to its end connected to the second conductor portion 25Ab1; the first conductor portion 25Aa3 extending clockwise around the coil axis Ax from the end of the second conductor portion 25Ab2 opposite to its end connected to the first conductor portion 25Aa2; the second conductor portion 25Ab3 extending clockwise around the coil axis Ax from the end of the first conductor portion 25Aa3 opposite to its end connected to the second conductor portion 25Ab2; and the first conductor portion 25Aa4 extending clockwise around the coil axis Ax to its connection with the first lead-out conductor 25b1, from the end of the second conductor portion 25Ab3 opposite to its end connected to the first conductor portion 25Aa3. As described above, in the winding portion 25A, the first conductor portions 25Aa1 to 25Aa4 and the second conductor portions 25Ab1 to 25Ab3 alternate with and are connected to each other. The first conductor portions 25Aa1 to 25Aa4 extend, as a whole, along the first side surface 10e, and the second conductor portions 25Ab1 to 25Ab3 extend, as a whole, along the second side surface 10f. If it is required to draw a boundary between the first conductor portions 25Aa1 to 25Aa4 and the second conductor portions 25Ab1 to 25Ab3, an imaginary plane VS1 passing through the coil axis Ax and parallel to the LT plane can be used as the boundary plane lying between the first conductor portions 25Aa1 to 25Aa4 and the second conductor portions 25Ab1 to 25Ab3.

The following describes how the coil conductor 25 is arranged relative to the magnetic base body 10 with reference to FIG. 2. FIG. 2 is a schematic plan view of the coil component 1 as viewed in the direction of the coil axis Ax. FIG. 2 shows the magnetic base body 10 and a transmission image of the coil conductor 25 as viewed in the direction of the coil axis Ax. In FIG. 2, the external electrodes 21, 22 are not shown for convenience of description. As described above, the ends of the generally ellipsoidal winding portion 25A are connected to the lead-out conductors 25B, and, in the winding portion 25A, the four first conductor portions 25Aa1 to 25Aa4 and the three second conductor portions 25Ab1 to 25Ab3 alternate with and are connected to each other. The coil conductor 25 is designed and arranged such that a distance D1 between the first conductor portions and the first side surface 10e is greater than a distance D2 between the second conductor portions and the second side surface 10f.

Figure 8A:
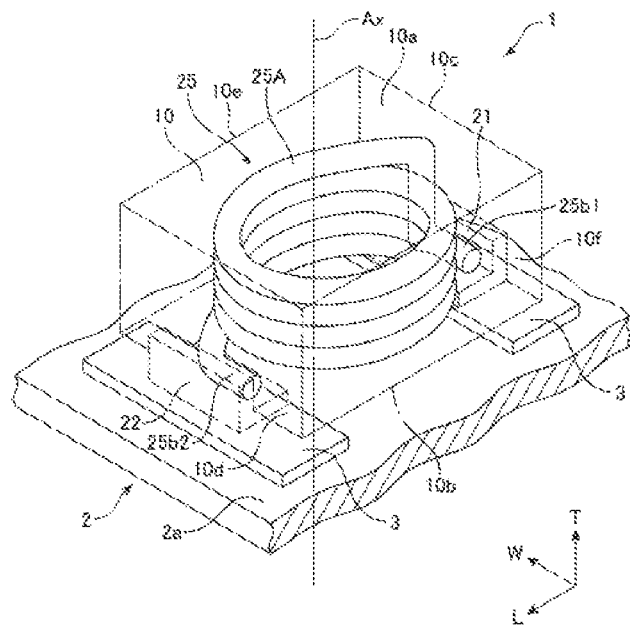
FIGS. 8A-8C are perspective views schematically showing a coil component according to modified examples.
Figure 8B:
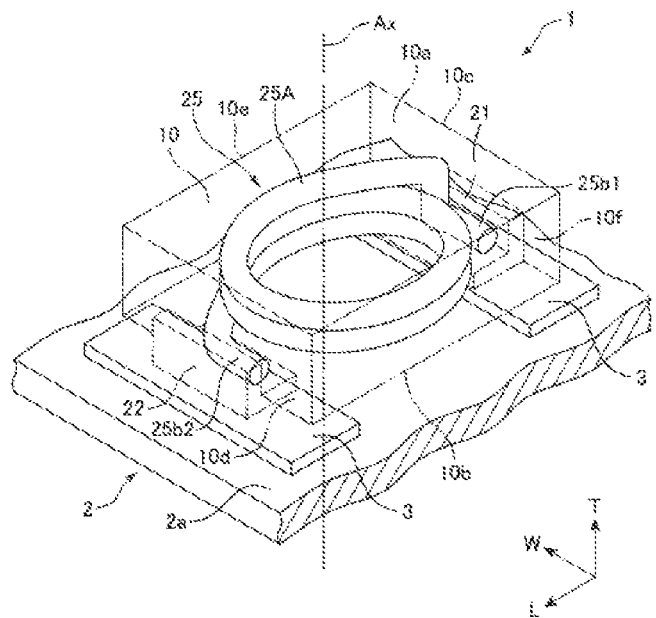
Figure 8C:
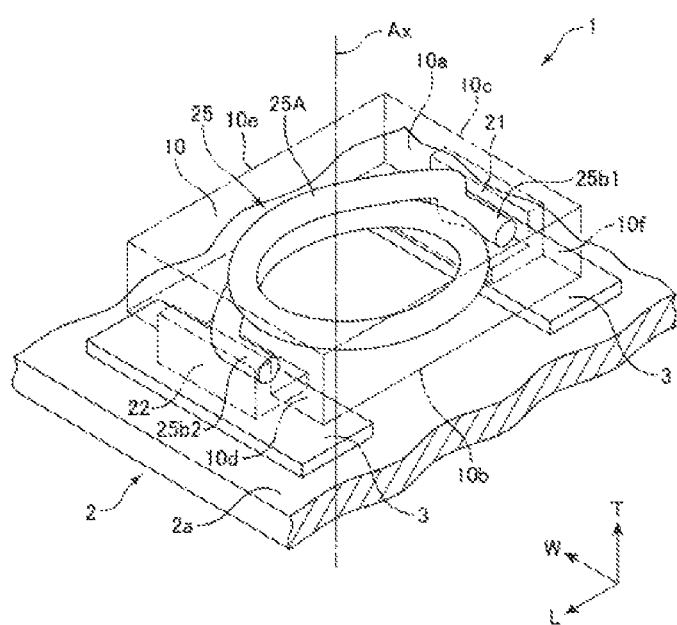

Since the first conductor portions are more than the second conductor portions in the winding portion 25A, the inductance L1 of the first conductor portions is higher than the inductance L2 of the second conductor portions. The first and second conductor portions exhibit inductance proportional to the square of the number of first conductor portions (the number of the conductors forming the first conductor portions) and the square of the number of the second conductor portions (the number of the conductors forming the second conductor portions). Therefore, L1/L2 representing the ratio of the inductance L1 of the first conductor portions to the inductance L2 of the second conductor portions is four when there are two first conductor portions and one second conductor portion as shown in FIG. 8C, 2.25 when there are three first conductor portions and two second conductor portions as shown in FIG. 8B, 1.77 when there are four first conductor portions and three second conductor portions and 1.44 when there are five first conductor portions and four second conductor portions as shown in FIG. 8A. In other words, when the number of first conductor portions included in the winding portion 25A ranges from two to five, the ratio L1/L2 may fall within the range of 1.44 to 4. This means that, when the winding portion 25A includes two to five first conductor portions, the magnetic flux lines produced around the first conductor portions by a change in current flowing through the coil conductor 25 is 1.44 to 4 times as many as the magnetic flux lines produced around the second conductor portions. Accordingly, if D1/D2, which represents the ratio of the distance D1 between the first conductor portions of the winding portion 25A and the first side surface 10e of the magnetic base body 10 to the distance D2 between the second conductor portions and the second side surface 10f, falls within substantially the same range as the ratio L1/L2, a sufficiently large region can be left between the first conductor portions and the first side surface 10e of the magnetic base body 10 in order to allow the more magnetic flux lines running around the first conductor portions to pass therethrough. For this reason, in one embodiment, the shape and positioning of the coil conductor 25 are determined such that the ratio D1/D2 falls within the range of 1.2 to 5.0. In an embodiment with two first conductor portions and one second conductor portion, the shape and positioning of the coil conductor 25 may be determined such that the ratio D1/D2 falls within the range of 3.5 to 4.5. In an embodiment with three first conductor portions and two second conductor portions, the shape and positioning of the coil conductor 25 may be determined such that the ratio D1/D2 falls within the range of 1.75 to 2.75. In an embodiment with four first conductor portions and three second conductor portions, the shape and positioning of the coil conductor 25 may be determined such that the ratio D1/D2 falls within the range of 1.37 to 2.17. In an embodiment with five first conductor portions and four second conductor portions, the shape and positioning of the coil conductor 25 may be determined such that the ratio D1/D2 falls within the range of 1.24 to 1.64.

If each of the first conductor portions 25Aa1 to 25Aa4 is at the same distance from the first side surface 10e, the distance D1 between the first conductor portions and the first side surface 10e can be defined as the distance between any one of the first conductor portions 25Aa1 to 25Aa4 and the first side surface 10e. If the first conductor portions 25Aa1 to 25Aa4 are at different distances from the first side surface 10e, the distance D1 between the first conductor portions and the first side surface 10e can be defined as the shortest one of the distances between the first conductor portions 25Aa1 to 25Aa4 and the first side surface 10e, or as an average among the distances between the first conductor portions 25Aa1 to 25Aa4 and the first side surface 10e. The distance between each of the first conductor portions 25Aa1 to 25Aa4 and the first side surface 10e may denote the shortest distance therebetween. The distance D2 between the second conductor portions and the second side surface 10f can be defined in the same manner as the distance D1. In other words, if each of the second conductor portions 25Ab1 to 25Ab3 is at the same distance from the second side surface 10f, the distance D2 between the second conductor portions and the second side surface 10f can be defined as the distance between any one of the second conductor portions 25Ab1 to 25Ab3 and the second side surface 10f. If the second conductor portions 25Ab1 to 25Ab3 are at different distances from the second side surface 10f, the distance D2 between the second conductor portions and the second side surface 10f can be defined as the shortest one of the distances between the second conductor portions 25Ab1 to 25Ab3 and the second side surface 10f, or as an average among the distances between the second conductor portions 25Ab1 to 25Ab3 and the second side surface 10f. The distance between each of the second conductor portions 25Ab1 to 25Ab3 and the second side surface 10f may denote the shortest distance therebetween.

When seen from above, the winding portion 25A may be shaped like an ellipsoid, an ellipse, a circle, a rectangle, a polygon other than a rectangle and various other shapes.

In one embodiment, when the base body 10 is seen from above, the L-axis-wise size of the first and second side surfaces 10e and 10f is larger than the W-axis-wise size of the first and second end surfaces 10c and 10d. In one embodiment, the winding portion 25A of the coil conductor 25 is sized such that its size in the direction parallel to the first and second side surfaces 10e and 10f (namely, the L-axis-wise size) is larger than its size in the direction parallel to the first and second end surface 10c and 10d (namely, the W-axis-wise size). The L-axis-wise size of the winding portion 25A may denote the largest size of the winding portion 25A in the L-axis direction, and the W-axis-wise size of the winding portion 25A may denote the largest size of the winding portion 25A in the W-axis direction.

An example method of manufacturing the coil component 1 according to one embodiment of the invention will now be described. The following describes an example method of manufacturing the coil component 1 using a compression molding process. To begin with, the metal magnetic particles are prepared. An insulating film is formed on the surface of the metal magnetic particles, as required. As described above, the metal magnetic particles may be a mixture of particles obtained by mixing together a plurality of types of particles having different average particle sizes. Following this, the prepared metal magnetic particles, a resin material, and a diluting solvent are mixed together, making a composite magnetic material. Next, the composite magnetic material is placed in a prepared mold having the coil conductor 25 installed therein, which is then exposed to molding pressure applied at a warm temperature of, for example, 50° C. to 150° C., and further heated to 150° C. to 400° C. for curing. In this way, the magnetic base body 10 having the coil conductor 25 therein is obtained. The coil conductor 25 is arranged in the mold such that, when seen in the direction of the coil axis Ax, the distance D1 between the first conductor portions of the coil conductor 25 and the first side surface 10e of the magnetic base body 10 is greater than the distance D2 between the second conductor portions of the coil conductor 25 and the second side surface 10f.

The heating performed to make the magnetic base body 10 may be performed in two steps as described above, or in a single step. When the heating is performed in a single step, the molding and curing are performed during the heating. In the magnetic base body 10, the resin contained in the composite magnetic material is cured and serves as the binder. The magnetic base body 10 may be molded at a warm temperature of around 80° C., for example. The molding pressure is, for example, 50 MPa to 200 MPa. The molding pressure can be appropriately adjusted to obtain a desired filling factor. The molding pressure is, for example, 100 MPa.

Next, a conductor paste is applied to the surface of the magnetic base body 10, which is obtained in the above-described manner, to form the external electrodes 21 and 22. The external electrode 21 is electrically connected to one end of the coil conductor 25 placed within the magnetic base body 10, and the external electrode 22 is electrically connected to the other end of the coil conductor 25 placed within the magnetic base body 10. The coil component 1 is obtained in the above-described manner.

The manufactured coil component 1 is mounted on the mounting substrate 2a using a reflow process. In this process, the mounting substrate 2a having the coil component 1 thereon passes at a high speed through a reflow furnace heated to, for example, a peak temperature of 260° C., and then the external electrodes 21, 22 are soldered to the corresponding land portions 3 of the mounting substrate 2a. In this way, the coil component 1 is mounted on the mounting substrate 2a, and thus the circuit board 2 is manufactured.

Figure 3:
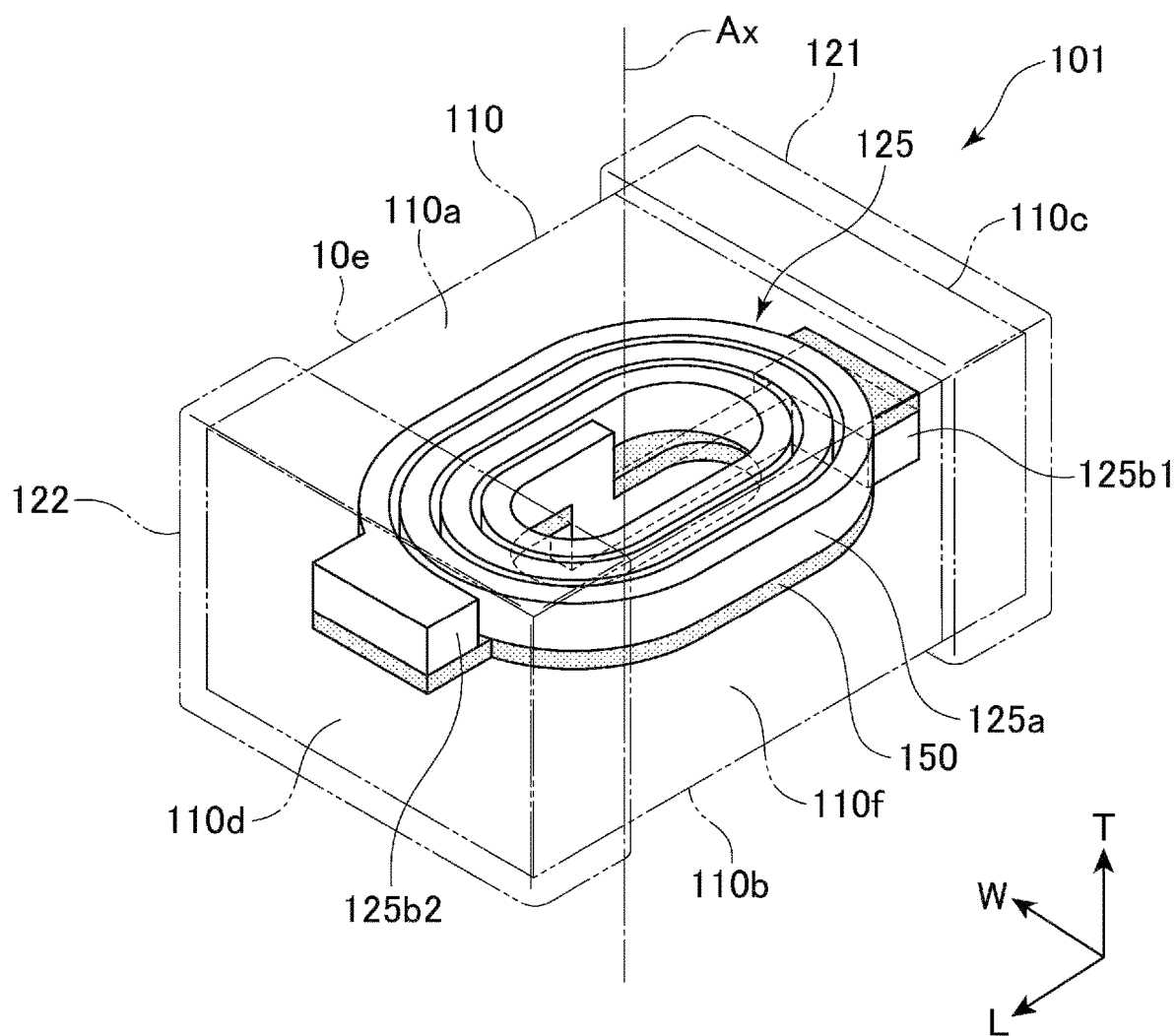
FIG. 3 is a perspective view schematically showing a coil component according to another embodiment of the present invention.

Next, a coil component 101 relating to another embodiment of the present invention will be described with reference to FIGS. 3 and 4. The coil component 101 is a planar coil. As shown, the coil component 101 includes a magnetic base body 110, an insulating plate 150 provided in the magnetic base body 110, a coil conductor 125 provided on top and bottom surfaces of the insulating plate 150 in the magnetic base body 110, an external electrode 121 provided on the magnetic base body 110, and an external electrode 122 provided on the magnetic base body 110 at a position spaced apart from the external electrode 121. The magnetic base body 110 is made of a magnetic material, similarly to the magnetic base body 10. The insulating plate 150 is a plate-shaped member made of an insulating material.

The magnetic base body 110 is formed in a rectangular parallelepiped shape as a whole. The magnetic base body 110 has a first principal surface 110*a*, a second principal surface 110*b*, a first end surface 110*c*, a second end surface 110*d*, a first side surface 110*e*, and a second side surface 110*f*. The outer surface of the magnetic base body 110 is defined by these six surfaces. The first principal surface 110*a* and the second principal surface 110*b* are at the opposite ends in the height direction, the first end surface 110*c* and the second end surface 110*d* are at the opposite ends in the length direction, and the first side surface 110*e* and the second side surface 110*f* are at the opposite ends in the width direction. The above explanation of the magnetic base body 10 also applies to the magnetic base body 110 to a maximum extent.

The coil conductor 125 includes a winding portion 125A and lead-out conductors 125B. The winding portion 125A is wound spirally around the coil axis Ax extending along the thickness direction (the T direction), and the lead-out conductors 125B led out from the opposite ends of the winding portion 125A to connect the opposite ends to the external electrodes 121, 122, respectively. The lead-out conductors 125B include a first lead-out conductor 125*b*1 connecting one of the ends of the winding portion 125A and the external electrode 121 and a second lead-out conductor 125*b*2 connecting the other end of the winding portion 125A and the external electrode 122.

Similarly to the winding portion 25A, the winding portion 125A includes a plurality of first conductor portions and one or more second conductor portions smaller in number than the first conductor portions. The description on the coil conductor 25 also applies to the coil conductor 125 to a maximum extent. In the illustrated embodiment, the winding portion 125A includes four first conductor portions 125Aa1 to 215Aa4 and three second conductor portions 125Ab1 to 125Ab3. The first conductor portions 125Aa1 to 125Aa4 are example first conductor portions included in the winding portion 125A, and the second conductor portions 125Ab1 to 125Ab3 are example second conductor portions included in the winding portion 125A. In one embodiment, the number of first conductor portions included in the winding portion 125A ranges from two to five. In one embodiment, the number of second conductor portions included in the winding portion 125A is smaller by one than the number of first conductor portions. The number of second conductor portions included in the winding portion 125A ranges from one to four, for example.

More specifically, the winding portion 125A includes: the first conductor portion 125Aa1 connected to the second lead-out conductor 125*b*2 and extending from its connection with the second lead-out conductor 125*b*2 clockwise around the coil axis Ax; the second conductor portion 125Ab1 extending clockwise around the coil axis Ax from the end of the first conductor portion 125Aa1 opposite to its end connected to the second lead-out conductor 125*b*2; the first conductor portion 125Aa2 extending clockwise around the coil axis Ax from the end of the second conductor portion 125Ab1 opposite to its end connected to the first conductor portion 125Aa1; the second conductor portion 125Ab2 extending clockwise around the coil axis Ax from the end of the first conductor portion 125Aa2 opposite to its end connected to the second conductor portion 125Ab1; the first conductor portion 125Aa3 extending clockwise around the coil axis Ax from the end of the second conductor portion 125Ab2 opposite to its end connected to the first conductor portion 125Aa2; the second conductor portion 125Ab3 extending clockwise around the coil axis Ax from the end of the first conductor portion 125Aa3 opposite to its end connected to the second conductor portion 125Ab2; and the first conductor portion 125Aa4 extending clockwise around the coil axis Ax to its connection with the first lead-out conductor 125*b*1, from the end of the second conductor portion 125Ab3 opposite to its end connected to the first conductor portion 125Aa3. The first conductor portion 125Aa4 penetrates the insulating plate 150 along the T-axis direction and then extends along the back surface of the insulating plate 150 (the negative-side surface in the T-axis direction) to the first lead-out conductor 125*b*1. As described above, in the winding portion 125A, the first conductor portions 125Aa1 to 125Aa4 and the second conductor portions 125Ab1 to 125Ab3 alternate with and are connected to each other. The first conductor portions 125Aa1 to 125Aa4 extend, as a whole, along the first side surface 110*e*, and the second conductor portions 125Ab1 to 125Ab3 extend, as a whole, along the second side surface 110*f*. If it is required to draw a boundary between the first conductor portions 125Aa1 to 125Aa4 and the second conductor portions 125Ab1 to 125Ab3, an imaginary plane VS1 passing through the coil axis Ax and parallel to the LT plane can be used as the boundary plane lying between the first conductor portions 125Aa1 to 125Aa4 and the second conductor portions 125Ab1 to 125Ab3.

Figure 4:
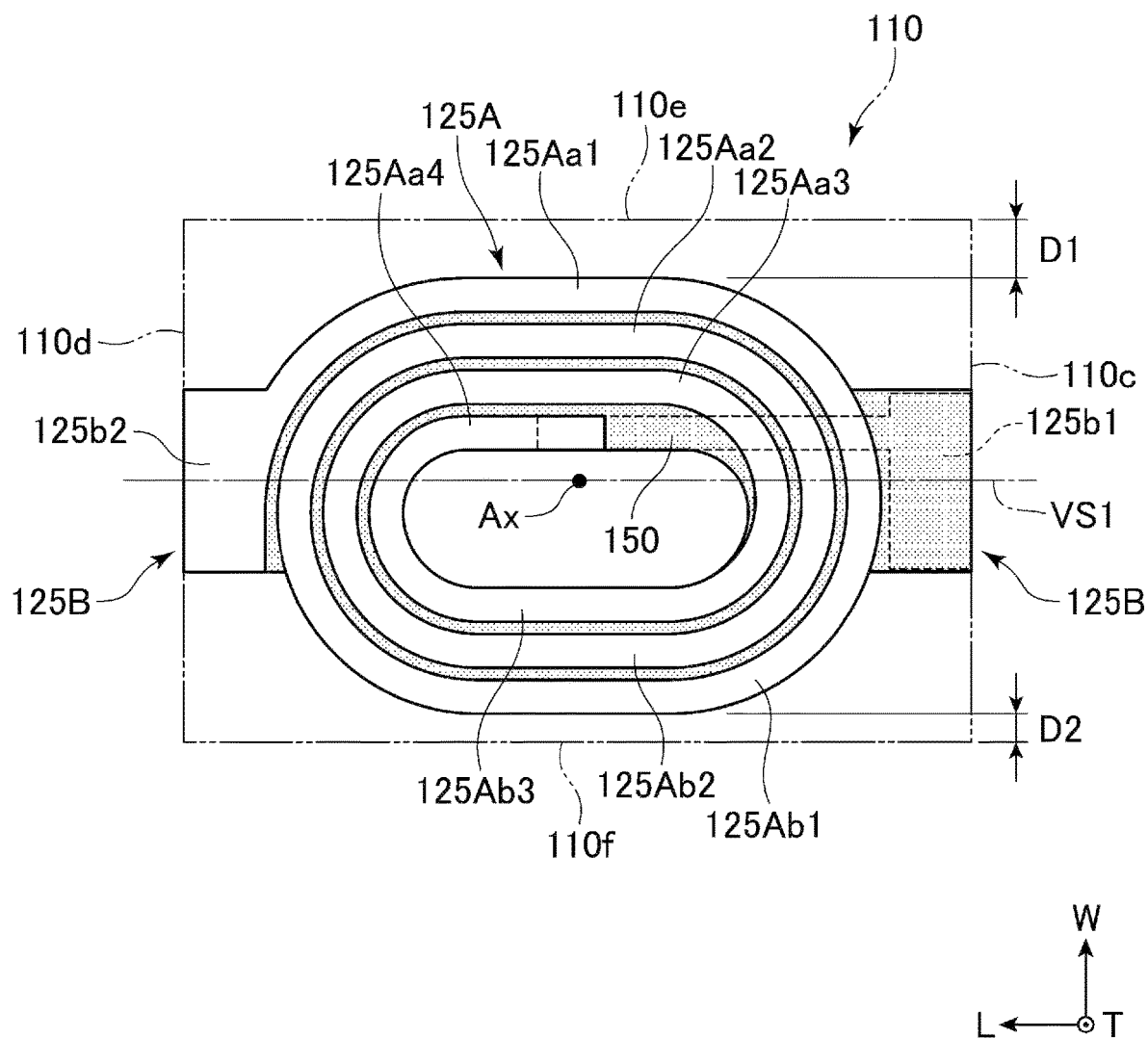
FIG. 4 is a schematic plan view of the coil component shown in FIG. 3.

The following describes how the coil conductor 125 is arranged relative to the magnetic base body 110 with reference to FIG. 4. FIG. 4 is a schematic plan view of the coil component 101 as viewed in the direction of the coil axis Ax. FIG. 4 shows the magnetic base body 110 and a transmission image of the coil conductor 125 as viewed in the direction of the coil axis Ax. In FIG. 4, the external electrodes 121, 122 are not shown for convenience of description. As described above, the ends of the generally ellipsoidal winding portion 125A are connected to the lead-out conductor 125B, and, in the winding portion 125A, the four first conductor portions 125Aa1 to 125Aa4 and the three second conductor portions 125Ab1 to 125Ab3 alternate with and are connected to each other. The coil conductor 125 is designed and arranged such that a distance D1 between the first conductor portions and the first side surface 110*e* is greater than a distance D2 between the second conductor portions and the second side surface 110*f*. As described above, in one embodiment, the number of first conductor portions included in the winding portion 25A ranges from two to five. A change in current flowing through the coil conductor 125 produces more magnetic flux lines around the first conductor portions. The value of D1/D2 is determined such that a sufficiently large region can be left to allow such magnetic flux lines to pass therethrough between the first conductor portions and the first side surface 110*e* of the magnetic base body 110. In one embodiment, the shape and positioning of the coil conductor 125 are determined such that the ratio D1/D2 falls within the range of 1.2 to 5.0.

Next, a description is given of an example of a manufacturing method of the coil component 101. To start with, an insulating plate 150 made of a magnetic material and shaped like a plate is prepared. Next, a photoresist is applied to the top surface and the bottom surface of the insulating plate 150, and then conductor patterns are transferred onto the top surface and the bottom surface of the insulating plate 150 by exposure, and development is performed. As a result, a resist having an opening pattern for forming the coil conductor 125 is formed on each of the top surface and the bottom surface of the insulating plate 150.

Next, plating is performed, so that each of the opening patterns is filled with a conductive metal. Next, etching is performed to remove the resists from the insulating plate 150, so that the coil conductors 125 are formed on the top surface and the bottom surface of the insulating plate 150. The through-hole formed in the insulating plate 150 is filled with a conductive metal to form a via connecting together the portions of the coil conductor 125, which are separately on the front and back sides of the insulating plate.

The magnetic base body 110 is subsequently formed on both surfaces of the insulating plate 150, where the coil conductor 125 has been formed. To form the magnetic base body 110, magnetic sheets are first made. In order to make the magnetic sheets, the metal magnetic particles are first prepared. An insulating film is formed on the surface of the metal magnetic particles, as required. As mentioned above, the metal magnetic particles may be a mixture of particles obtained by mixing together a plurality of types of particles having different average particle sizes. Following this, the prepared metal magnetic particles, a resin material, and a diluting solvent are mixed and kneaded together, making a slurry. The slurry contains the metal magnetic particles dispersed therein. Subsequently, the slurry is applied in the form of a sheet a sheet onto a base material such as a PET film, and the applied slurry is dried to volatilize the diluting solvent. This in turn makes a magnetic sheet made of the resin and having the metal magnetic particles dispersed therein. Two such magnetic sheets are provided, between which the above-described coil conductor is placed, and pressure is then applied to them while they are heated. In this way, a laminated body is made. The method of making the laminated body is not limited to the same. According to another method of making the laminated body, the insulating plate 150 having the coil conductor 125 formed thereon is placed in a mold, into which the slurry obtained by mixing together the metal magnetic particles and resin material is poured. Pressure is then applied to the mold while it is being heated, thereby making the laminated body. The laminated body may be molded at a warm temperature of 50° C. to 150° C., for example, around 80° C. The molding pressure is, for example, 50 MPa to 200 MPa. The molding pressure can be appropriately adjusted to obtain a desired filling factor. The molding pressure is, for example, 100 MPa. Next, the laminated body is subjected to heat treatment at the curing temperature of the resin, for example, at a temperature of 150° C. to 400° C. In this way, the magnetic base body 110 containing the coil conductor 125 therein can be obtained. The external electrodes 121, 122 are provided on the external surface of the magnetic base body 110 at predetermined positions. In this manner, the coil component 101 is made.

Figure 5:
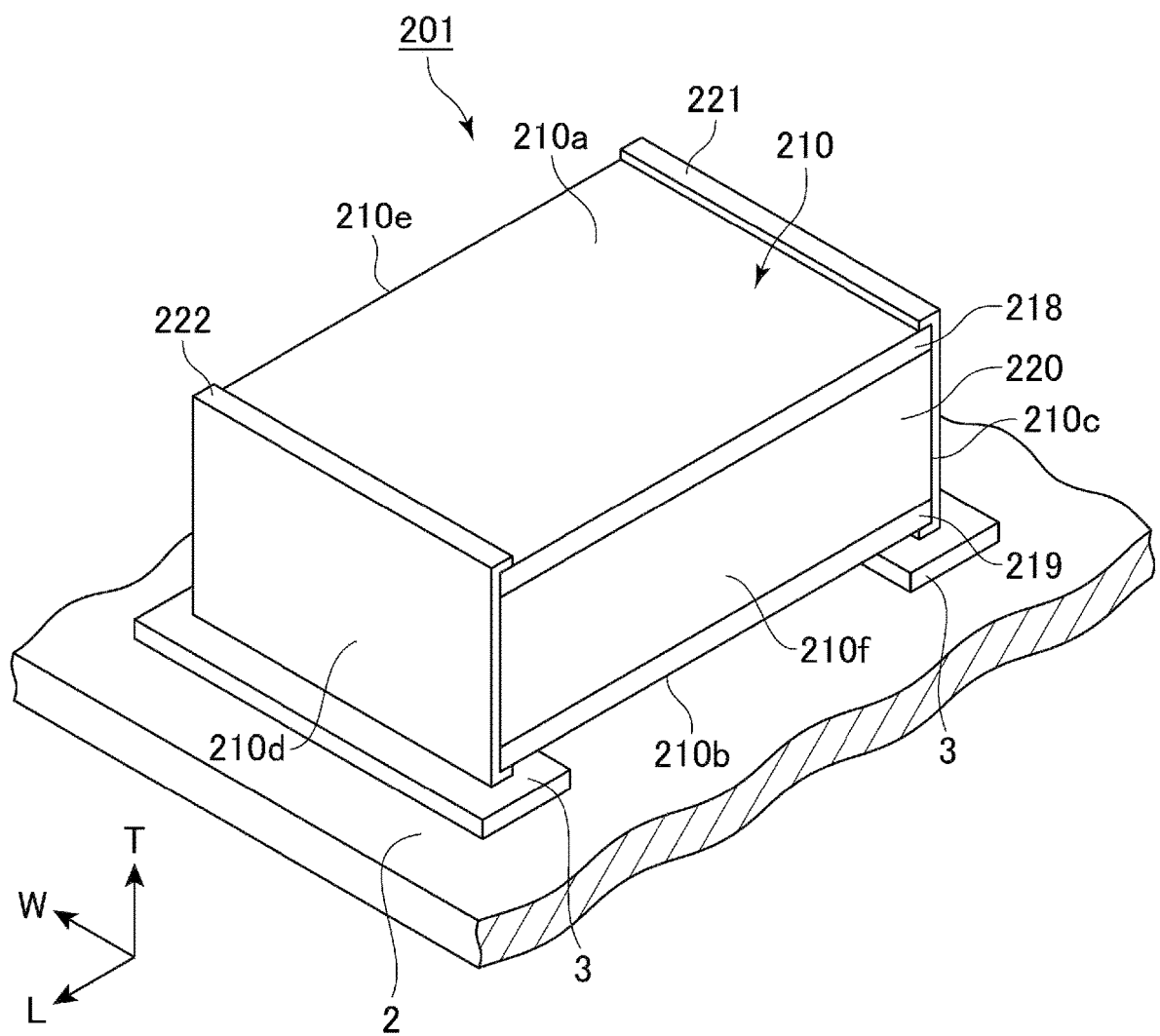
FIG. 5 is a perspective view schematically showing a coil component according to another embodiment of the present invention.
Figure 6:
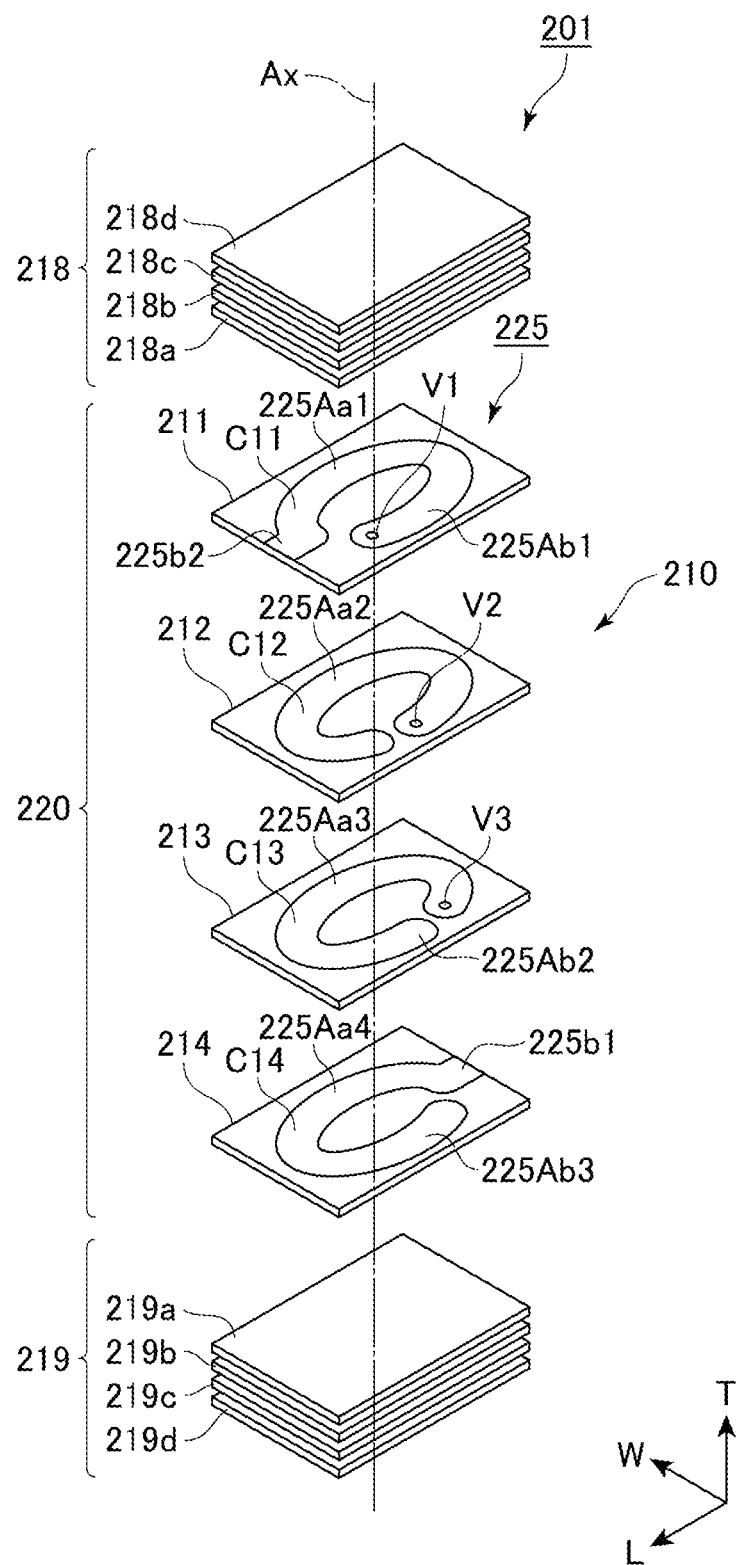
FIG. 6 is an exploded perspective view schematically showing the coil component shown in FIG. 5.
Figure 7:
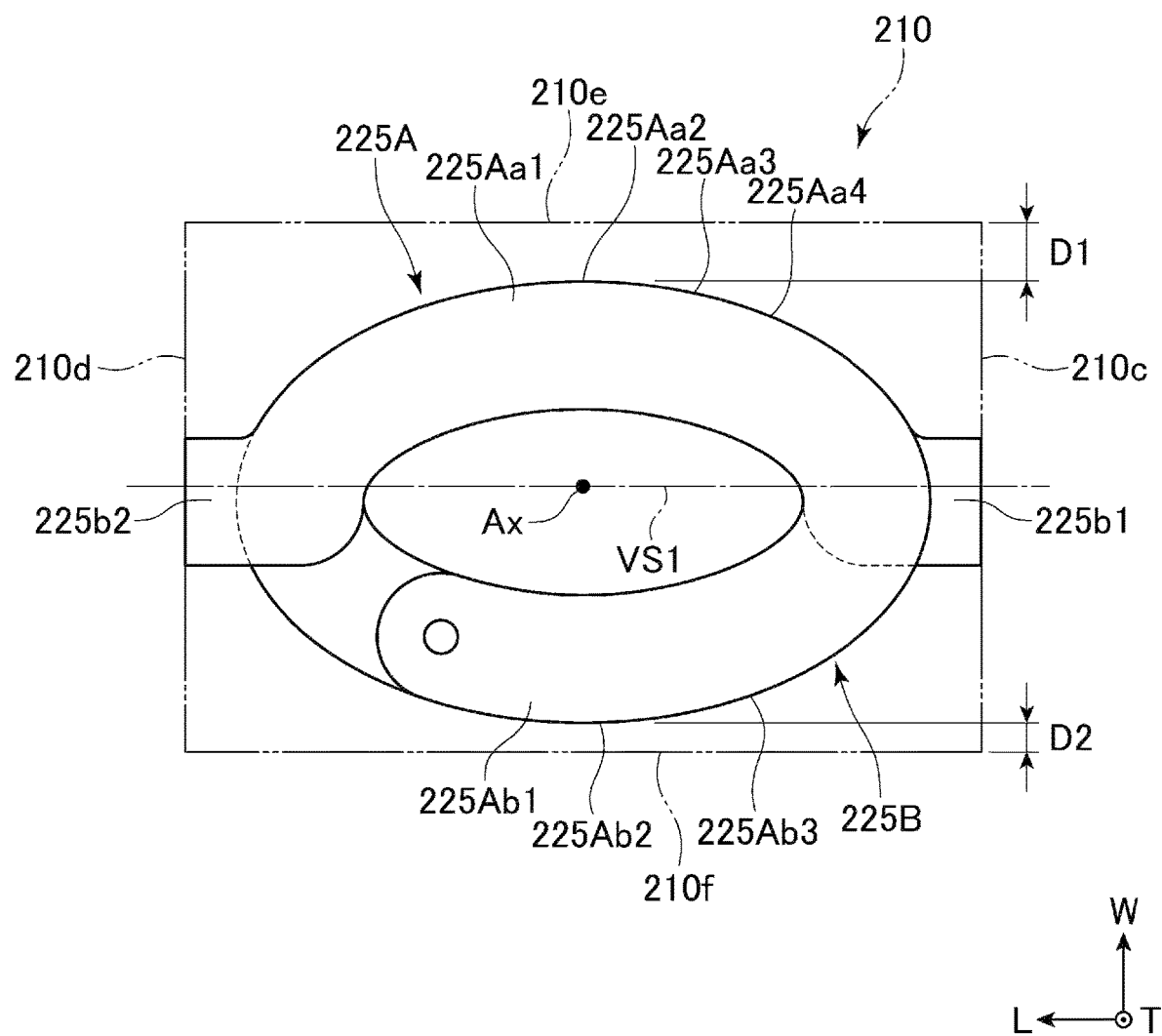
FIG. 7 is a schematic plan view of the coil component shown in FIG. 5.

The following describes a coil component 201 relating to another embodiment of the present invention with reference to FIGS. 5 to 7. The coil component 201 is a laminated coil. As shown, the coil component 201 includes a magnetic base body 210, a coil conductor 225 disposed in the magnetic base body 210, an external electrode 221 disposed on the magnetic base body 210, and an external electrode 222 disposed on the magnetic base body 210 at a position spaced apart from the external electrode 221. The magnetic base body 210 has a pair of external electrodes disposed thereon. The magnetic base body 210 is made of a magnetic material, similarly to the magnetic base body 10.

The magnetic base body 210 is made of a magnetic material and formed in a rectangular parallelepiped shape. The magnetic base body 210 includes a magnetic layer 220 having a coil 225 embedded therein, a top cover layer 218 formed on the top surface of the magnetic layer 220 and made of a magnetic material, and a bottom cover layer 219 formed on the bottom surface of the magnetic layer 220 and made of a magnetic material. The top cover layer 218 includes magnetic films 218*a* to 218*d* made of a magnetic material, and the bottom cover layer 219 includes magnetic films 219*a* to 219*d* made of a magnetic material. The boundary between the magnetic layer 220 and the top cover layer 218 and the boundary between the magnetic layer 220 and the bottom cover layer 219 may not be clearly identified depending on the manufacturing method used to make the magnetic base body 210. The magnetic base body 210 is generally shaped as a rectangular parallelepiped and has a first principal surface 210*a*, a second principal surface 210*b*, a first end surface 210*c*, a second end surface 210*d*, a first side surface 210*e*, and a second side surface 210*f*. The outer surface of the magnetic base body 210 is defined by these six surfaces. The first principal surface 210*a* and the second principal surface 210*b* are at the opposite ends in the height direction, the first end surface 210*c* and the second end surface 210*d* are at the opposite ends in the length direction, and the first side surface 210*e* and the second side surface 210*f* are at the opposite ends in the width direction. The above explanation of the magnetic base body 10 also applies to the magnetic base body 210 to a maximum extent.

The magnetic layer 220 includes magnetic films 211 to 214. In the magnetic layer 220, the magnetic films 211, 212, 213 and 214 are stacked in the stated order from the positive side to the negative side in the T-axis direction. On the respective top surfaces of the magnetic films 211 to 214, conductor patterns C11 to C14 are formed. The conductor patterns C11 to C14 are formed by, for example, printing a conductive paste made of a highly conductive metal or alloy via screen printing. The conductive paste may be made of Ag, Pd, Cu, Al, or alloys thereof.

The magnetic films 211 to 213 are provided with vias V1 to V3, respectively, at a predetermined position therein. The vias V1 to V3 are formed by forming a through-hole at the predetermined position in the magnetic films 211 to 213 so as to extend through the magnetic films 211 to 213 in the T axis direction and filling the through-holes with a conductive material. Each of the conductor patterns C11 to C14 is electrically connected to the respective adjacent conductor patterns through the vias V1 to V3. The conductor patterns C11 to C14 connected in this manner form the spiral coil conductor 225.

As shown in FIG. 7, the coil conductor 225 includes a winding portion 225A and lead-out conductors 225B. The winding portion 225A is wound spirally around the coil axis Ax extending along the thickness direction (the T direction), and the lead-out conductors 225B led out from the opposite ends of the winding portion 225A to connect the opposite ends to the external electrodes 221, 222, respectively. The lead-out conductors 225B include a first lead-out conductor 225*b*1 connecting one of the ends of the winding portion 225A and the external electrode 221 and a second lead-out conductor 225*b*2 connecting the other end of the winding portion 225A and the external electrode 222.

Similarly to the winding portion 25A, the winding portion 225A includes a plurality of first conductor portions and one or more second conductor portions smaller in number than the first conductor portions. The description on the coil conductor 25 also applies to the coil conductor 225 to a maximum extent. In the illustrated embodiment, the winding portion 225A includes four first conductor portions 225Aa1 to 225Aa4 and three second conductor portions 225Ab1 to 225Ab3. The first conductor portions 225Aa1 to 225Aa4 are example first conductor portions included in the winding portion 225A, and the second conductor portions 225Ab1 to 225Ab3 are example second conductor portions included in the winding portion 225A. In one embodiment, the number of first conductor portions included in the winding portion 225A ranges from two to five. In one embodiment, the number of second conductor portions included in the winding portion 225A is smaller by one than the number of first conductor portions. The number of second conductor portions included in the winding portion 225A ranges from one to four, for example.

More specifically, the winding portion 225A includes: the first conductor portion 225Aa1 connected to the second lead-out conductor 225b2 and extending from its connection with the second lead-out conductor 225b2 clockwise around the coil axis Ax; the second conductor portion 225Ab1 extending clockwise around the coil axis Ax from the end of the first conductor portion 225Aa1 opposite to its end connected to the second lead-out conductor 225b2; the first conductor portion 225Aa2 extending clockwise around the coil axis Ax from the end of the second conductor portion 225Ab1 opposite to its end connected to the first conductor portion 225Aa1; the second conductor portion 225Ab2 extending clockwise around the coil axis Ax from the end of the first conductor portion 225Aa2 opposite to its end connected to the second conductor portion 225Ab1; the first conductor portion 225Aa3 extending clockwise around the coil axis Ax from the end of the second conductor portion 225Ab2 opposite to its end connected to the first conductor portion 225Aa2; the second conductor portion 225Ab3 extending clockwise around the coil axis Ax from the end of the first conductor portion 225Aa3 opposite to its end connected to the second conductor portion 225Ab2; and the first conductor portion 225Aa4 extending clockwise around the coil axis Ax to its connection with the first lead-out conductor 225b1, from the end of the second conductor portion 225Ab3 opposite to its end connected to the first conductor portion 225Aa3. The first conductor portions 225Aa1 to 225Aa4 extend, as a whole, along the first side surface 210e, and the second conductor portions 225Ab1 to 225Ab3 extend, as a whole, along the second side surface 210f. If it is required to draw a boundary between the first conductor portions 225Aa1 to 225Aa4 and the second conductor portions 225Ab1 to 225Ab3, an imaginary plane VS1 passing through the coil axis Ax and parallel to the LT plane can be used as the boundary plane lying between the first conductor portions 225Aa1 to 225Aa4 and the second conductor portions 225Ab1 to 225Ab3.

The following describes how the coil conductor 225 is arranged relative to the magnetic base body 210 with reference to FIG. 7. FIG. 7 is a schematic plan view of the coil component 201 as viewed in the direction of the coil axis Ax. FIG. 7 shows the magnetic base body 210 and a transmission image of the coil conductor 225 as viewed in the direction of the coil axis Ax. In FIG. 7, the external electrodes 221, 222 are not shown for convenience of description. As described above, the ends of the generally ellipsoidal winding portion 225A are connected to the lead-out conductors 225B, and, in the winding portion 225A, the four first conductor portions 225Aa1 to 225Aa4 and the three second conductor portions 225Ab1 to 225Ab3 alternate with and are connected to each other. The coil conductor 225 is designed and arranged such that a distance D1 between the first conductor portions and the first side surface 210e is greater than a distance D2 between the second conductor portions and the second side surface 210f. As described above, in one embodiment, the number of first conductor portions included in the winding portion 225A ranges from two to five. A change in current flowing through the coil conductor 225 produces more magnetic flux lines around the first conductor portions. The value of D1/D2 is determined such that a sufficiently large region can be left to allow such magnetic flux lines to pass therethrough between the first conductor portions and the first side surface 210e of the magnetic base body 210. In one embodiment, the shape and positioning of the coil conductor 225 are determined such that the ratio D1/D2 falls within the range of 1.2 to 5.0.

Next, a description is given of an example manufacturing method of the coil component 201. The coil component 201 can be manufactured by, for example, a lamination process. An example is hereinafter described of the manufacturing method of the coil component 201 using the lamination process.

To begin with, magnetic sheets are formed, which are to be used as the magnetic films 218a to 218d constituting the top cover layer 218, the magnetic films 211 to 214 constituting the magnetic layer 220, and the magnetic films 219a to 219d constituting the bottom cover layer 219. These magnetic sheets are made of a composite magnetic material containing a binder and metal magnetic particles. The magnetic sheets for the coil component 201 may be made by the same method as the magnetic sheets used in the manufacturing process of the coil component 1.

After this, a coil conductor is provided in the magnetic sheets. Specifically, a through-hole is formed in the respective magnetic sheets, which are to be used as the magnetic films 211 to 213, at a predetermined position so as to extend through the sheets in the T-axis direction. Following this, a conductive paste is printed by screen printing on the top surface of each of the magnetic sheets, which are to be used as the magnetic films 211 to 214, so that an unsintered conductor pattern is formed on each magnetic sheet. Also, the through-hole formed in each magnetic sheet is filled with the conductive paste.

Next, the magnetic sheets, which are to be used as the magnetic films 211 to 214 are stacked to obtain a coil laminated body. The magnetic sheets, which are to be used as the magnetic films 211 to 214, are stacked such that the unsintered conductor patterns C11 to C14 formed on the respective magnetic sheets are each electrically connected to the adjacent conductor patterns through the unsintered vias V1 to V3.

Following this, a plurality of magnetic sheets are stacked to form a top laminated body, which is to be used as the top cover layer 218. Similarly, a plurality of magnetic sheets are stacked to form a bottom laminated body, which is to be used as the bottom cover layer 219.

Next, the bottom laminated body, the coil laminated body, and the top laminated body are stacked in the stated order in the direction of the T axis from the negative side to the positive side, and these stacked laminated bodies are bonded together by thermal compression using a pressing machine to make a main laminated body. Instead of forming the bottom, coil and top laminated bodies, the main laminated body may be made by sequentially stacking all of the magnetic sheets prepared in advance and bonding the stacked magnetic sheets collectively by thermal compression.

Next, the main laminated body is segmented to a desired size by using a cutter such as a dicing machine or a laser processing machine to make a chip laminate. Next, the chip laminate is degreased and then heated. The end portions of the resulting chip laminate are subjected to a polishing process such as barrel-polishing, if necessary.

Next, a conductive paste is applied to both end portions of the chip laminated body to form the external electrodes 221 and 222. The coil component 201 is obtained in the above-described manner.

Advantageous effects of the above embodiments will now be described. Since the first conductor portions are more than the second conductor portions in the coil conductors 25, 125 and 225 relating to the embodiments of the present invention, a change in current flowing through the coil conductor produces more magnetic flux lines around the first conductor portions than around the second conductor portions. Since the distance D1 between the first conductor portions and the first side surface 10e, 110e, 210e of the magnetic base body 10, 110, 210 is greater than the distance D2 between the second conductor portions and the second side surface 10f, 110f, 210f of the magnetic base body 10, 110, 210, a larger region can be left between the first conductor portions and the first side surface 10e, 110e, 210e of the magnetic base body 10, 110, 210 to allow the magnetic flux lines produced by the first conductor portions to pass therethrough. Since the relation of D1>D2 is true, the region between the first conductor portions and the first side surface 10e, 110e, 210e of the magnetic base body 10, 110, 210 has a larger area than the region between the second conductor portions and the second side surface 10f, 110f, 210f of the magnetic base body 10, 110, 210.

In conventional coil components, the coil conductor is arranged in the magnetic base body such that, for the purposes of simplified characteristics calculation and manufacturing process, the distance between the first conductor portions of the coil conductor and the first side surface of the magnetic base body is equal to the distance between the second conductor portions and the second side surface of the magnetic base body. The conventional coil components are described under the assumption that the coil conductor includes a plurality of first conductor portions and one or more second conductor portions smaller in number than the first conductor portions. As for the coil conductor in the conventional coil components, the first conductor portions correspond to the first conductor portions 25Aa1 to 25Aa4 relating to the above-described embodiment, and the second conductor portions correspond to the second conductor portions 25Ab1 to 25Ab3 relating to the above-described embodiment, except for their positioning relative to the magnetic base body. The conventional coil components are described under the assumption that the first side surface of the magnetic base body is one of the surfaces bounding the magnetic base body that faces the first conductor portions of the coil conductor, and the second side surface of the magnetic base body is one of the surfaces bounding the magnetic base body that faces the second conductor portions of the coil conductor. The second side surface also faces the first side surface. Since, in the conventional coil components, the coil conductor is arranged in the magnetic base body such that the distance between the first conductor portions and the first side surface of the magnetic base body is equal to the distance between the second conductor portions and the second side surface of the magnetic base body, more compact magnetic base bodies may pose the following problem. Although a sufficiently large region may be left between the second conductor portions and the second side surface of the magnetic base body to allow the magnetic flux lines produced by the second conductor portions to pass therethrough, a sufficiently large region cannot be left between the first conductor portions and the first side surface of the magnetic base body to allow more magnetic flux lines produced by the first conductor portions to pass therethrough. In this case, some of the magnetic flux lines produced around the first conductor portions can not pass through the region between the first conductor portions and the first side surface of the magnetic base body and are therefore forced to take a detour and pass thorough a different region more distant from the first conductor portions (for example, a region near the corners of the magnetic base body when seen from above). This means that, in the conventional coil components, some of the magnetic flux lines produced by the first conductor portions follow a bypass route passing through a region distant from the first conductor portions. The magnetic path length of the magnetic flux lines passing through the region distant from the first conductor portions is greater than the magnetic path length of the magnetic flux lines passing through the region between the first conductor portions and the first surface of the base body. Since the inductance is proportional to the cross-sectional area of the magnetic path and inversely proportional to the length of the magnetic path, the coil component may exhibit deteriorated inductance if the coil conductor is arranged in the conventional manner, namely, in such a manner that the distance between the first conductor portions and the first side surface becomes equal to the distance between the second conductor portions and the second side surface. In the above-described embodiments of the present invention, on the other hand, a larger region can be left between the first conductor portions and the first surface of the base body to allow the magnetic flux lines produced by the first conductor portions to pass therethrough. Accordingly, the deterioration of the inductance resulting from the size reduction of the magnetic base body can be reduced in the coil components relating to the embodiments of the present invention than in the conventional coil components.

If the coil conductor is positioned in the conventional manner, the distance between the first conductor portions and the first side surface of the magnetic base body is equal to the distance between the second conductor portions and the second side surface of the magnetic base body despite the fact that a change in current flowing through the coil conductor produces more magnetic flux lines around the first conductor portions than around the second conductor portions, which is because the first conductor portions are more than the second conductor portions. As a result, the magnetic flux lines produced around the first conductor portions densely gather in the region between the first conductor portions and the first surface of the base body, and magnetic saturation is likely to occur in the region. The above-described embodiments of the present invention can prevent the gathering of the magnetic flux lines in the region between the first conductor portions and the first side surface 10e, 110e, 210e of the magnetic base body 10, 110, 210. Consequently, the coil component 1, 101, 201 can achieve improved magnetic saturation characteristics.

As described above, the conventional coil components are designed such that the distance between the first conductor portions and the first side surface of the magnetic base body is equal to the distance between the second conductor portions and the second side surface of the base body. Therefore, if a larger interval is provided between the first conductor portions and the first side surface of the magnetic base body to allow more magnetic flux lines to pass through the region between the first conductor portions and the first side surface of the magnetic base body, a larger interval is also provided between the second conductor portions and the second side surface of the magnetic base body. This in turn disadvantageously increases the overall size of the magnetic base body. In the above-described embodiments, on the other hand, the coil conductor 25, 125, 225 is arranged such that the distance between the first conductor portions and the first side surface 10e, 110e, 210e of the magnetic base body 10, 110, 210 is selectively increased. Accordingly, the coil component 1, 101, 201 can accomplish a smaller size than the conventional coil components.

In the above-described embodiments, when the magnetic base body 10, 110, 210 is seen from above, the L-axis-wise size of the first side surface 10e, 110e, 210e is larger than the W-axis-wise size of the first and second end surfaces 10c, 110c, 210c and 10d, 110d, 210d. Accordingly, a larger region can be left between the first conductor portions of the coil conductor 25, 125, 225 and the first side surface 10e, 110e, 210e of the magnetic base body 10, 110, 210.

The dimensions, materials, and arrangements of the constituent elements described for the above various embodiments are not limited to those explicitly described for the embodiments, and these constituent elements can be modified to have any dimensions, materials, and arrangements within the scope of the present invention. Furthermore, constituent elements not explicitly described herein can also be added to the above-described embodiments, and it is also possible to omit some of the constituent elements described for the embodiments.

What is claimed is:

1. A coil component comprising:
   a base body having a first surface extending along a coil axis and a second surface opposing the first surface;
   a first external electrode provided on the base body;
   a second external electrode provided on the base body; and
   a coil conductor electrically connected to the first and second external electrodes, the coil conductor extending around the coil axis, the coil conductor wound in only one direction from the first external electrode to the second external electrode,
   wherein the coil conductor has a winding portion, the winding portion has a plurality of first conductor portions and one or more second conductor portions smaller in number than the first conductor portions, and the first and second conductor portions alternate with and are connected to each other,
   wherein the first conductor portions are disposed one above the other along the coil axis, and the second conductor portions are disposed one above the other along the coil axis, and
   wherein a distance between the first conductor portions and the first surface is greater than a distance between the second conductor portions and the second surface.

2. The coil component of claim 1,
   wherein the base body has a third surface extending along the coil axis and connecting together the first and second surfaces, and
   wherein, when seen in a direction along the coil axis, the first surface has a larger size than the third surface, and the coil conductor has a larger size in a direction parallel to the first surface than in a direction parallel to the third surface.

3. The coil component of claim 1, wherein, in the winding portion, the number of the first conductor portions is five and the number of the second conductor portions is four.

4. The coil component of claim 3, wherein D1 represents a distance between the first conductor portions and the first surface and D2 represents a distance between the second conductor portions and the second surface, and a ratio D1/D2 ranges from 1.2 to 5.0.

5. The coil component of claim 1, wherein, in the winding portion, the number of the first conductor portions is four and the number of the second conductor portions is three.

6. The coil component of claim 1, wherein, in the winding portion, the number of the first conductor portions is three and the number of the second conductor portions is two.

7. The coil component of claim 1, wherein, in the winding portion, the number of the first conductor portions is two and the number of the second conductor portions is one.

8. The coil component of claim 1, wherein, in the coil conductor, the number of the second conductor portions is smaller by one than the number of the first conductor portions.

9. A DC/DC converter comprising the coil component of claim 1.

10. A circuit board comprising:
    the coil component of claim 1; and
    a mounting substrate soldered to the first and second external electrodes.

11. An electronic device comprising the circuit board of claim 10.

12. The coil component of claim 1, wherein the number of the first conductor portions is five and the number of the second conductor portions is four, and wherein when D1 represents a distance between the first conductor portions and the first surface and D2 represents a distance between the second conductor portions and the second surface, a ratio D1/D2 ranges from 1.24 to 1.64.

13. The coil component of claim 1, wherein the number of the first conductor portions is four and the number of the second conductor portions is three, and wherein when D1 represents a distance between the first conductor portions and the first surface and D2 represents a distance between the second conductor portions and the second surface, a ratio D1/D2 ranges from 1.37 to 2.17.

14. The coil component of claim 1, wherein the number of the first conductor portions is three and the number of the second conductor portions is two, and wherein when D1 represents a distance between the first conductor portions and the first surface and D2 represents a distance between the second conductor portions and the second surface, a ratio D1/D2 ranges from 1.75 to 2.75.

15. The coil component of claim 1, wherein the number of the first conductor portions is two and the number of the second conductor portions is one, and wherein when D1 represents a distance between the first conductor portions and the first surface and D2 represents a distance between the second conductor portions and the second surface, a ratio D1/D2 ranges from 3.5 to 4.5.

* * * * *